(12) United States Patent  
Chavan et al.

(10) Patent No.: US 7,038,321 B1  
(45) Date of Patent: May 2, 2006

(54) METHOD OF ATTACHING A FLIP CHIP DEVICE AND CIRCUIT ASSEMBLY FORMED THEREBY

(75) Inventors: Abhijeet V. Chavan, Carmel, IN (US); Jeffrey A. Mars, Kokomo, IN (US); Ian D. Jay, Logansport, IN (US); Johnna L. Wyant, Kokomo, IN (US); David W. Ihms, Russiaville, IN (US); John K. Isenberg, Rossville, IN (US); Roger E. Worl, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/908,162

(22) Filed: Apr. 29, 2005

(51) Int. Cl.
*H01L 23/52* (2006.01)
*H01L 23/48* (2006.01)
*H01L 29/40* (2006.01)

(52) U.S. Cl. .............. 257/778; 257/678; 257/414; 257/415; 257/728; 257/782; 257/786; 438/124; 438/126; 438/127; 310/313 R; 310/340; 361/772

(58) Field of Classification Search ............ 257/678, 257/778, 414, 415, 419, 782, 783, 786, 728, 257/737, 738, E23.069, E23.021; 310/313 R, 310/340; 361/772, 760; 438/124, 126, 127; 29/25.35, 841; 174/52.2, 52.3, 260, 261; 333/193

See application file for complete search history.

(56) References Cited

U.S. PATENT DOCUMENTS

| 5,444,301 | A  | * | 8/1995  | Song et al. ............... 257/737 |
| 5,459,368 | A  | * | 10/1995 | Onishi et al. ........... 310/313 R |
| 5,900,581 | A  | * | 5/1999  | Ootake ..................... 174/52.2 |
| 5,969,461 | A  | * | 10/1999 | Anderson et al. ........ 310/313 R |
| 6,181,015 | B1 | * | 1/2001  | Gotoh et al. ................. 257/778 |
| 6,262,513 | B1 | * | 7/2001  | Furukawa et al. ....... 310/313 R |
| 6,297,072 | B1 | * | 10/2001 | Tilmans et al. ............. 438/106 |
| 6,316,840 | B1 | * | 11/2001 | Otani ......................... 257/787 |
| 6,441,478 | B1 | * | 8/2002  | Park .......................... 257/698 |
| 6,566,745 | B1 | * | 5/2003  | Beyne et al. ............... 257/680 |
| 6,661,084 | B1 | * | 12/2003 | Peterson et al. ............ 257/680 |
| 6,713,828 | B1 |   | 3/2004  | Chavan et al. ............. 257/415 |
| 6,750,521 | B1 |   | 6/2004  | Chilcott et al. ............. 257/414 |
| 6,851,297 | B1 | * | 2/2005  | Cunningham et al. ..... 73/24.06 |
| 2003/0157426 | A1 |   | 8/2003  | Jordan et al. ............... 430/200 |
| 2003/0205948 | A1 | * | 11/2003 | Lin et al. ................... 310/312 |

FOREIGN PATENT DOCUMENTS

JP             63307326 A   * 12/1988

* cited by examiner

*Primary Examiner*—Kenneth Parker
*Assistant Examiner*—Chris C. Chu
(74) *Attorney, Agent, or Firm*—Stefan V. Chmielewski

(57) ABSTRACT

A method of flip-chip mounting a circuit device to a substrate in a manner that avoids damage and impairment of a fragile or otherwise sensitive element on the device facing the substrate, and a circuit assembly produced thereby. The assembly includes a substrate having at least two sets of bonding sites spaced apart from each other to define an intermediate surface region therebetween. The device is attached to the bonding sites with solder connections, with the solder connections being present on a surface of the device that faces the substrate and on which the element is present so that the element overlies the intermediate surface region of the substrate. An underfill material is present between the device and the substrate and encapsulates the solder connections. The underfill material is separated from the intermediate surface region of the substrate so that the underfill material does not contact the element.

10 Claims, 3 Drawing Sheets

US 7,038,321 B1

METHOD OF ATTACHING A FLIP CHIP DEVICE AND CIRCUIT ASSEMBLY FORMED THEREBY

BACKGROUND OF THE INVENTION

The present invention generally relates to circuit devices adapted for attachment to substrates using flip-chip techniques. More particularly, this invention relates to a flip-chip technique for attaching a circuit device having a surface region with which contact with an underfill material is to be avoided.

A flip chip is generally a monolithic surface mount (SM) semiconductor device, such as an integrated circuit (IC), having bead-like terminals formed on the same chip surface as the circuitry of the chip. The terminals, typically in the form of solder bumps, secure the chip to a substrate and electrically interconnect the flip chip circuitry to a conductor pattern formed on the substrate, which may be a ceramic substrate, printed wiring board, flexible circuit, silicon substrate, etc. The solder bumps are typically located at or near the perimeter of the flip chip on bond pads that are electrically interconnected with the flip chip circuitry. Reflow solder techniques are widely employed to initially form the solder bumps and then later form the chip-to-substrate connections after placement of the chip on the substrate. Such a technique typically entails depositing a controlled quantity of solder on the bond pads of the flip chip by electrodeposition or a thick-film deposition technique such as stencil printing, and then heating the solder above its liquidus temperature to form the solder bumps on the bond pads. After cooling to solidify the solder bumps, the chip is soldered to the substrate by registering the solder bumps with their respective conductors on the substrate, heating the solder bumps to a temperature above the liquidus temperature of the solder to cause the solder to reflow, and then cooling the solder to form solder connections that metallurgically and electrically interconnect each flip chip bond pad to a conductor on the substrate.

Placement of the chip and reflow of the solder must be precisely controlled not only to coincide with the spacing and size of the bond pads, but also to control the height of the solder connections after soldering. As is well known in the art, controlling the height of solder connections after reflow is often necessary to prevent the surface tension of the molten solder from drawing the flip chip excessively close to the substrate during the reflow operation. Sufficient spacing between the chip and its substrate, often termed the "stand-off height," is often necessary to allow the penetration of an underfill material, which fills the space between the chip and substrate to reduce thermal stresses on the solder connections. Stand-off height can be controlled by the amount of solder deposited on the flip chip to form the solder bump and/or by the use of solder stops that limit the surface area over which the solder bump is allowed to reflow.

Control of solder bump position, size, and pitch are dictated in part by the manner in which the solder is deposited on the bond pads. Fine solder bump pitches can generally be obtained with electroplating techniques that require a plating mask, typically a photoresist material. Larger solder bumps are typically formed by printing a solder paste using a stencil, typically formed of a photoimageable dry film. Both of these techniques are suitable for devices that are relatively flat and do not have a fragile surface, such as a diaphragm, beam, or other micromachine on the surface where the bumps are required. For example, if a pressure sensor is desired to be flip-chip mounted to a substrate, attempts to use a dry film process to print the solder can possibly cause yield loss due to breakage of the pressure sensor's diaphragm. While other mounting techniques are available for pressure sensors, such as wire-bonding, certain advantages associated with flip-chip technology make a flip-chip mounted sensor desirable. For example, pressure sensors that rely on capacitive sensing have an inherent high impedance and are thus very susceptible to variation in electrical charges, electromagnetic interference (EMI), and coupling at the interface between the sensor and its associated readout circuit. In addition, pressure sensors are very susceptible to stresses in the substrates on which they are mounted. A flip-chip mounted device reduces capacitive coupling effects, can achieve better stress management, and generally provides a more robust connection than wire-bonding in terms of shock and vibration resistance. Finally, the ability to flip-chip mount a pressure sensor enables the pressure sensor to be simultaneously reflow soldered with other surface mount components to a substrate, eliminating the cost and time that would be required to perform a separate wire-bonding operation.

From the above it can be seen that, while flip-chip mounting of a pressure sensor chip is desirable in terms of processing and performance, dry film techniques suitable for forming solder bumps of sufficient size are not compatible with the fragile diaphragms of the sensors. Accordingly, it would be desirable if an improved method were available for forming solder bumps on a flip-chip mounted pressure sensor, as well as other flip-chip mounted devices having fragile micromachines or otherwise sensitive surface areas.

SUMMARY OF THE INVENTION

The present invention provides a method that enables a device to be flip-chip mounted to a substrate in a manner that avoids damage and impairment of a fragile or otherwise sensitive element on a surface of the device facing the substrate. The invention also provides a circuit assembly produced by such a method.

According to a first aspect of this invention, such a circuit assembly includes a substrate having conductors with bonding sites, with at least two sets of the bonding sites being spaced apart from each other to define an intermediate surface region therebetween. A circuit device is attached to the bonding sites with solder connections, with the solder connections being present on a surface of the circuit device that faces the substrate and on which a movable element is present so that the movable element overlies the intermediate surface region of the substrate. An underfill material is present between the circuit device and the substrate and encapsulates the solder connections. Finally, at least one dam separates the underfill material from the intermediate surface region of the substrate so that the underfill material does not contact the movable element.

According to a second aspect of the invention, mounting of a circuit device to a substrate involves providing a substrate with conductors on a surface thereof, in which each of the conductors has a bonding site and the conductors define at least two sets of the bonding sites spaced apart from each other to define an intermediate surface region therebetween. At least one dam is formed on the substrate and separates the at least two sets of bonding sites from the intermediate surface region of the substrate. A circuit device is then reflow soldered to the substrate, by which solder connections are formed that attach the circuit device to the bonding sites. The solder connections are present on a surface of the circuit device that faces the substrate and on which a movable element is present so as to overlie the intermediate surface region of the substrate. Finally, the circuit device is underfilled with an underfill material to encapsulate the solder connections, with the dam separating the underfill material from the intermediate surface region of the substrate so that the underfill material does not flow into contact the movable element.

According to a preferred aspect of the invention, the solder bumps are formed by positioning a stencil over the surface of the circuit device, printing a solder material onto bond pads on the circuit device through holes in the stencil, and then reflowing the solder material to form the solder bumps. According to another preferred aspect of the invention, the stencil has a recess in a surface thereof and the movable element of the circuit device is accommodated within the recess during printing of the solder material with the stencil.

In view of the above, the present invention provides the ability to flip-chip mount device chips with fragile micromachines or otherwise sensitive surface areas, such as the diaphragm of a pressure sensor chip, in a manner that achieves the processing and performance advantages of flip-chip mounting, yet avoids damage and impairment of the movable element that would occur if contacted by the underfill material. The invention also avoids hazards associated with using dry film techniques to form the solder bumps required to flip-chip mount the device.

Other objects and advantages of this invention will be better appreciated from the following detailed description.

DESCRIPTION OF THE PREFERRED EMBODIMENT

Figure 1:
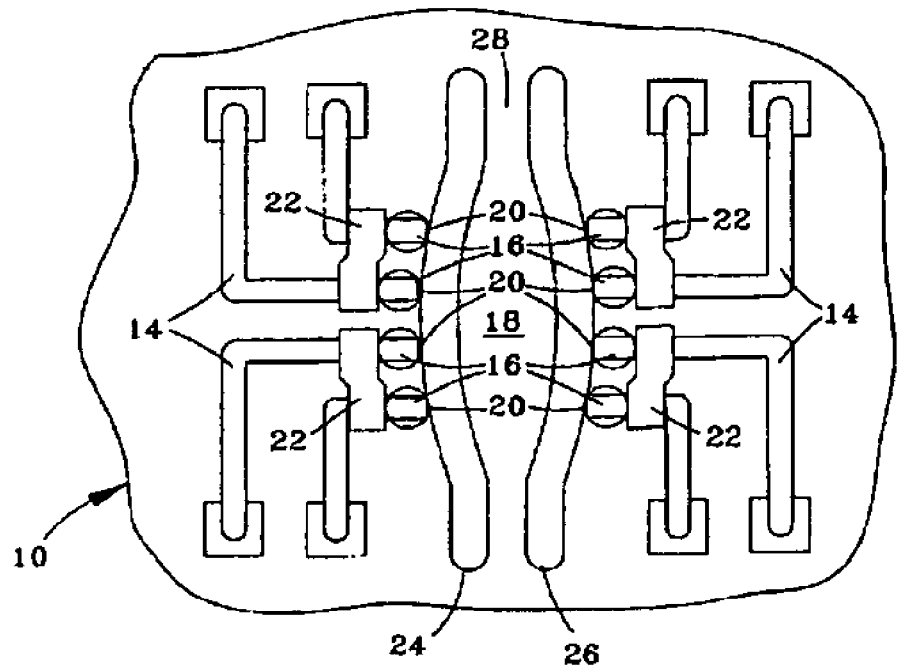
FIG. 1 is a plan view of a surface portion of a circuit substrate configured for flip-chip mounting a circuit device in accordance with the present invention.
Figure 2:
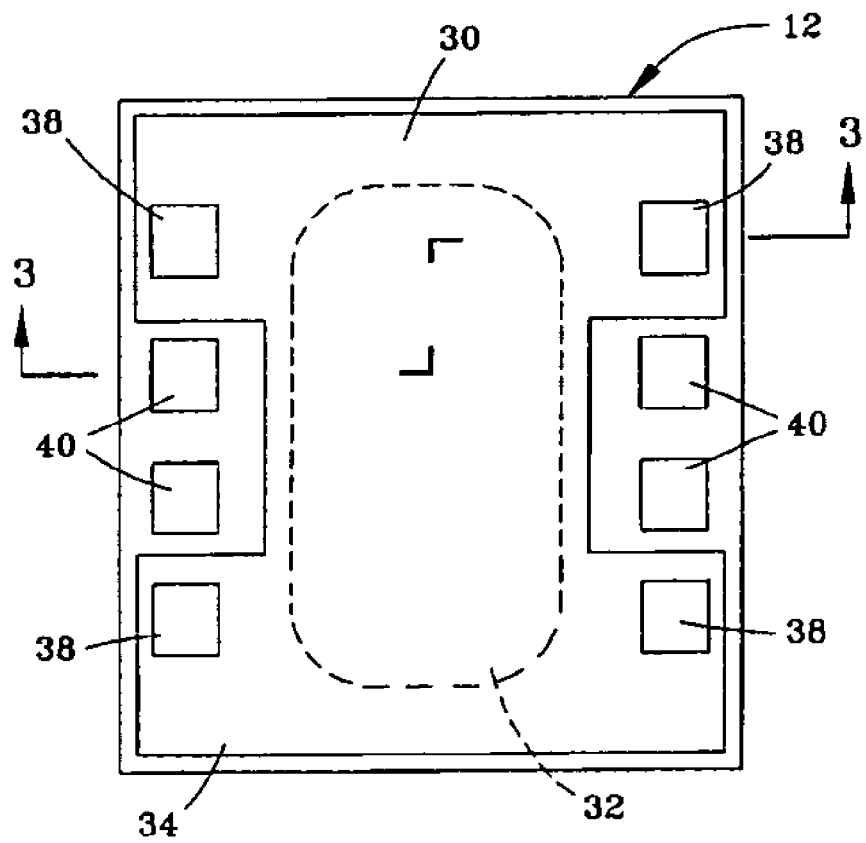
FIG. 2 is a plan view of a circuit device configured for attachment to the substrate of FIG. 1 in accordance with a preferred embodiment of the present invention.
Figure 3:
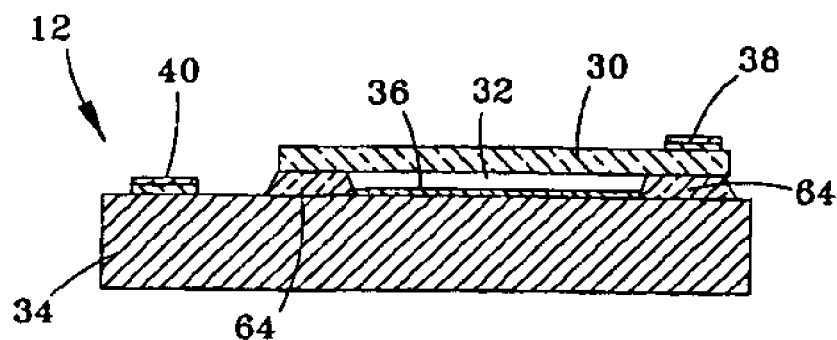
FIGS. 3 through 6 represent a series of steps for forming solder bumps on the circuit device as viewed from section line 3—3 of FIG. 2 in accordance with a preferred embodiment of the present invention.
Figure 8:
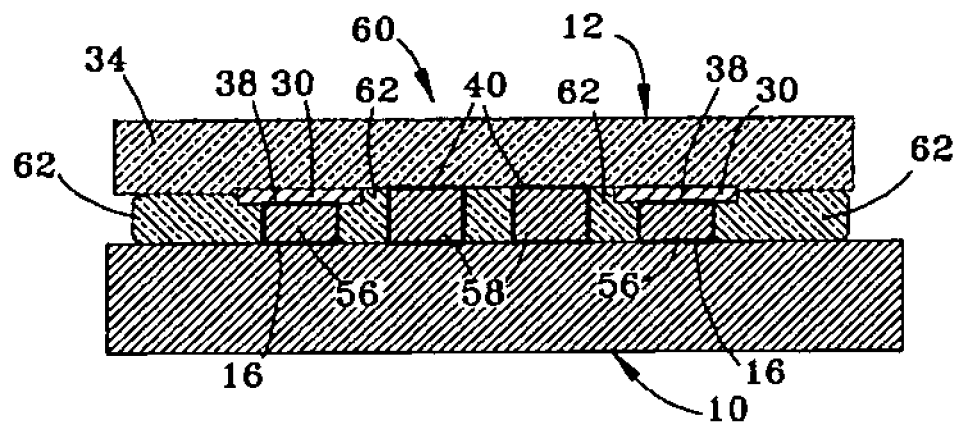
FIGS. 8 and 9 are cross-sectional views of the circuit device of FIG. 6 after being reflow soldered to the substrate of FIG. 1 and as viewed from section lines 8—8 and 9—9, respectively, of FIG. 7.
Figure 9:
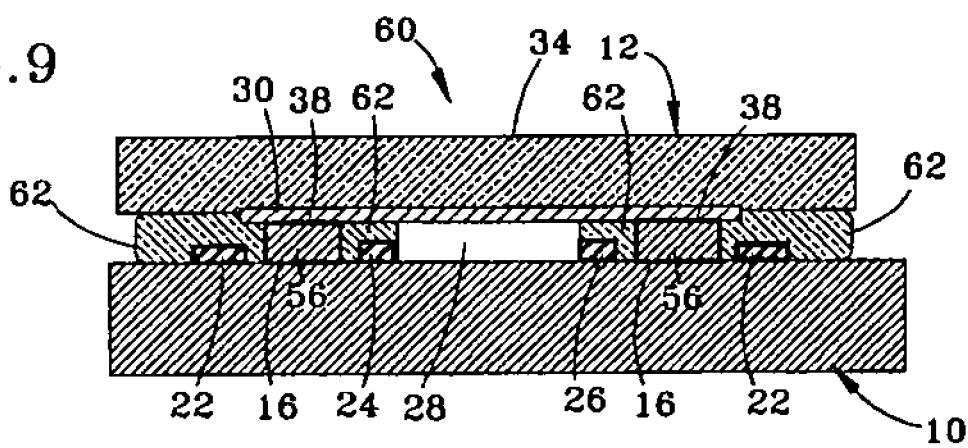

A portion of a circuit substrate 10 is depicted in FIG. 1 as being configured for flip-chip mounting a pressure sensor chip 12 schematically represented in FIGS. 2 and 3. The substrate 10 may be formed of essentially any known circuit substrate material, such as a ceramic (e.g., alumina), printed wiring board, flexible circuit, or silicon substrate, as is known in the art. FIGS. 8 and 9 are cross-sectional representations of the substrate 10 and chip 12 as they appear following reflow soldering of the device 12 to conductors 14 on the substrate 10. While the invention will be illustrated and described with reference to a circuit device configured as a pressure sensor chip 12, those skilled in the art will appreciate that the teachings of the invention are not limited to pressure sensor chips, but are more broadly applicable to a variety of surface mounted circuit devices that can be flip-chip mounted to a substrate, such as ball grid arrays (BGA's), micro-ball grid arrays (mBGA's) and chip scale packages (CSP's).

FIG. 1 shows the conductors 14 located and configured on the substrate 10 to define two opposing sets of bonding sites 16 that are spaced apart by a surface region 18 of the substrate 10. As is conventional, the conductors 14 are printed or otherwise formed on the surface of the substrate 10 to have at least an upper surface formed of a solderable material, which denotes a material to which solder will metallurgically bond and reliably adhere for purposes of making an electrical interconnection. As an example, suitable conductor materials for ceramic circuit boards include various silver-platinum and silver-palladium alloys used to form thick film conductors. As is also conventional, each bonding site 16 is delimited on three sides by a terminal end 20 and the width of its conductor 14, and delimited on a fourth side by a solder stop 22 that extends across the width of its conductor 14. Suitable materials for the solder stops 22 include known dielectric materials such as a mixture of glass frits.

FIG. 1 also represents the substrate 10 as further including a pair of dams 24 and 26. Each dam 24 and 26 separates one set of bonding sites 16 from the surface region 18 between the sets of bonding sites 16. Furthermore, the dams 24 and 26 are spaced apart along their lengths to define a path 28 that is generally free of obstructions. The path 28 is continuous between the dams 24 and 26 so that bidirectional flow of a fluid through the path 28 is possible. As will be explained in greater detail below, the dams 24 and 26 serve to prevent the flow of an underfill material (62 in FIGS. 8 and 9) into the path 28 and onto the surface region 18 of the substrate 10 between the bonding sites 16. For this purpose, suitable materials for the dams 24 and 26 include dielectric materials, such as dielectric materials suitable for use as solder dams and commercially available from a variety of sources, an example of which is a dielectric ink available under the name QM45 from E.I. DuPont de Nemours and Company, Inc. The solder stops 22 and dams 24 and 26 can be deposited and cured simultaneously on the substrate 10, such that each is bonded to the substrate 10.

As noted above, the substrate 10 depicted in FIG. 1 is configured for flip-chip mounting the pressure sensor chip 12 represented in FIGS. 2 and 3. As a result of being adapted for pressure sensing, the chip 12 has been fabricated to have a diaphragm 30 capable of deflecting in response to changes in pressure, and more particularly to a pressure differential between the exterior surface of the diaphragm 30 and a closed cavity 32 defined by and between the diaphragm 30 and the chip substrate 34. As depicted in FIG. 3, the cavity 32 is defined by supporting the diaphragm 30 above an insulating surface region 36 of the substrate 34 with features or layers 64 deposited and/or patterned on the substrate 34. Deflection of the diaphragm 30 can be sensed by a variety of techniques, including piezoresistive sensing. In a preferred embodiment, deflection of the diaphragm 30 is sensed capacitively, i.e., by forming the diaphragm 30 and the substrate 34 of electrically conductive materials (e.g., doped silicon), charging the diaphragm 30 and substrate 34, and sensing the electrical capacitance between the diaphragm 30 and substrate 34 in response to changes in the gap therebetween. For this purpose, the chip 12 is shown in FIGS. 2 and 3 as being provided with bond pads 38 and 40 electrically coupled to the diaphragm 30 and substrate surface region 36, respectively. The bond pads 38 and 40 are preferably aligned in rows, as depicted in FIG. 2.

Figure 4:
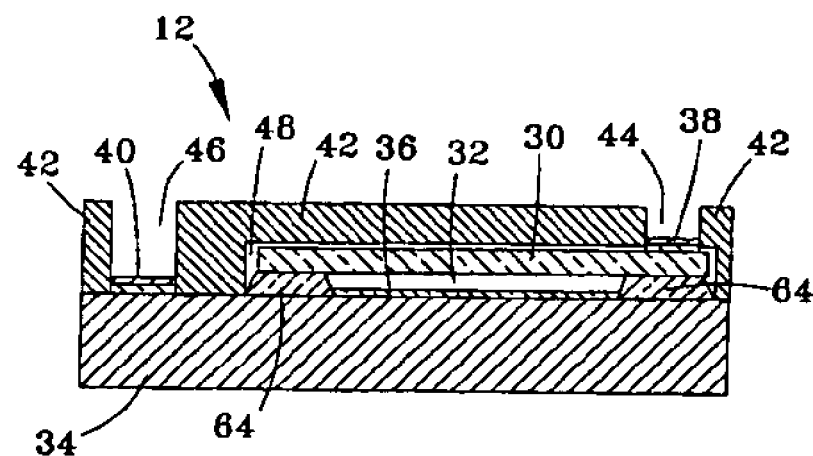
Figure 5:
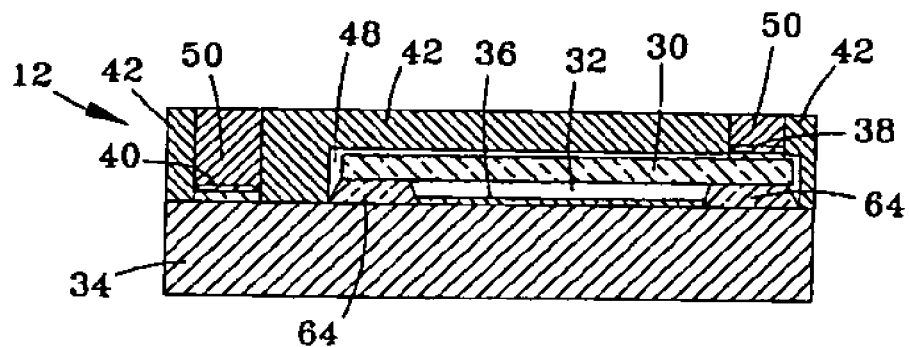
Figure 6:
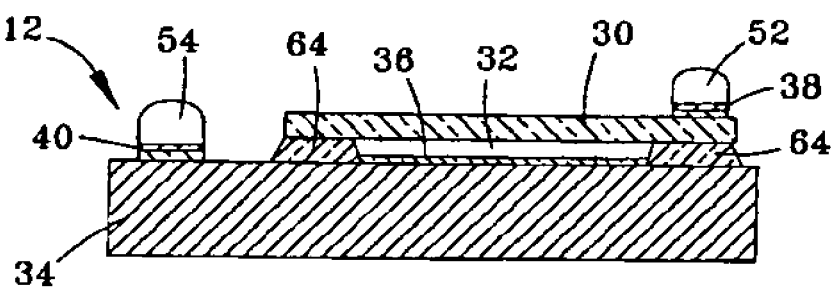
Figure 7:
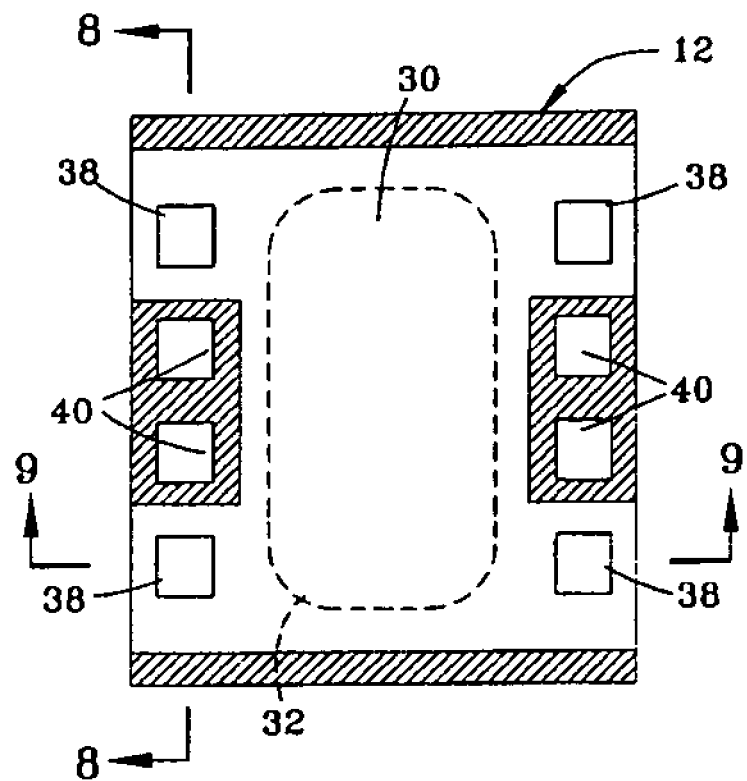
FIG. 7 is a plan view of the circuit device as depicted in FIG. 4, with coverage of a stencil graphically represented.

As known in the art, advantages associated with capacitive pressure sensing include low thermal drift, high resolution, and the ability to be used in a force-balance system using electrostatic restoring forces. However, drawbacks exist for capacitive sensing methods, including susceptibility to variation in electrical charges, EMI, coupling at the interface between the sensor chip 12 and its associated readout circuit (not shown), and susceptibility to stresses in the substrate 34 on which the diaphragm 30 is mounted. The present invention provides the capability of overcoming or avoiding these drawbacks by processing the chip 12 to be capable of flip-chip mounting to the substrate 10 of FIG. 1. A suitable process for this purpose is represented in FIGS. 4 through 6. FIG. 4 represents a step in which a stencil 42 has been placed on the chip substrate 34. The stencil 42 is formed to have through-holes 44 and 46 that are aligned (e.g., optically with mechanical assistance) with the bond pads 38 and 40, respectively, on the device 12. Because the diaphragm 30 is susceptible to damage, the stencil 42 is also formed to have a cavity 48 sized to accommodate the diaphragm 30 and its support structure. FIG. 7 is a plan view similar to FIG. 2, but indicates the coverage of the stencil 42 and its cavity 48, in which the surface region of the device substrate 34 contacted by the stencil 42 is represented by shading. As evident from FIGS. 4 and 5, the cavity 48 can be defined by thinning certain portions of the stencil 42.

FIG. 5 represents the result of a depositing a solder paste 50 on the bond pads 38 and 40 through the stencil through-holes 44 and 46. A variety of suitable compositions are known for the solder paste 50, most of which contain a mixture of solder alloy particles and a flux compound. Suitable solder alloys include, but are not limited to, tin-based, lead-based and indium-based alloys, with notable examples being tin-lead alloys containing about 10 to about 60 percent tin, with possible alloying additions of antimony, silver, etc. Preferred solder alloys can be reflowed at sufficiently low temperatures to avoid thermal damage to the circuitry of the chip 12 and substrate 10. FIG. 6 shows the result of reflowing the solder paste 50, during which the flux vaporized or burned off and the solder alloy particles melted and coalesced to form solder bumps 52 and 54.

The device 12 as represented in FIG. 6 is ready for registration and reflow soldering to the substrate 10. During this process, the solder bumps 52 and 54 are accurately and uniquely registered with the bonding sites 16 on the chip 12, after which the solder bumps 52 and 54 are reflowed by heating so that the molten solder wets and, upon resolidification, metallurgically bonds to the bonding sites 16, thereby attaching the chip 12 to the bonding sites 16 and the associated circuitry on the substrate 10. Reflow can be achieved by any of a number of techniques well known in the art, and therefore will not be discussed in detail here.

Following reflow, the chip 12 is underfilled with the underfill material 62 to yield a circuit assembly 60 represented in FIGS. 8 and 9, which are side and end views, respectively, relative to the chip 12 in FIG. 7. The underfill material 62 spans the gap between the chip 12 and substrate 10 and encapsulates the solder connections 56 and 58 formed as a result of reflowing the solder bumps 52 and 54. As known in the art, underfilling serves to reduce thermal stresses on the solder connections 56 and 58, and can be carried out by any of a number of techniques well known in the art, and therefore will not be discussed in detail here.

As evident from FIGS. 8 and 9, following the reflow step the dams 24 and 26 do not contact the surface of the chip 12 between the diaphragm 30 and the solder connections 56 and 58, but rather form gaps too narrow for the underfill material 62 to flow beyond. As such, the dams 24 and 26 allow the underfill material 62 to fully encapsulate the solder connections 56 and 58 but prevent the underfill material 62 from flowing into the gap between the diaphragm 30 and the substrate 10, coinciding with the path 28 between the dams 24 and 26. As such, the present invention prevents the underfill material 62 from damaging or interfering with the operation of the diaphragm 30, and the path 28 remains unobstructed so that the chip 12 can detect pressure changes in its surroundings. The unobstructed path 28 is also able to vent gases that evolve during the underfilling step from beneath the circuit device 12, and reduces the risk that any debris generated during processing of the substrate 10, chip 12, and assembly 60 might become trapped beneath the chip 12.

While the invention has been described in terms of a preferred embodiment, it is apparent that other forms could be adopted by one skilled in the art. Accordingly, the scope of the invention is to be limited only by the following claims.

What is claimed is:

1. A circuit assembly comprising:
    a substrate having conductors with bonding sites, at least two sets of the bonding sites being spaced apart from each other to define an intermediate surface region therebetween;
    a circuit device attached to the bonding sites with solder connections, the solder connections being present on a surface of the circuit device that faces the substrate and on which a movable element is present, the movable element overlying the intermediate surface region of the substrate;
    an underfill material between the circuit device and the substrate and encapsulating the solder connections; and
    at least one dam separating the underfill material from the intermediate surface region of the substrate so that the underfill material does not contact the movable element, the at least one dam defining a bidirectional venting path between the movable element of the circuit device and the intermediate surface region of the substrate.

2. The circuit assembly according to claim 1, wherein the at least one dam is bonded to the substrate between the intermediate surface region and the bonding sites.

3. The circuit assembly according to claim 2, wherein the at least one dam is in proximity to but does not contact the surface of the circuit device between the movable element and the solder connections thereof.

4. The circuit assembly according to claim 1, wherein the at least one dam comprises multiple dams on the substrate, each of the dams being between the intermediate surface region of the substrate and a corresponding one of the at least two sets of bonding sites.

5. The circuit assembly according to claim 4, wherein the dams are spaced apart to define the bidirectional venting path between the movable element of the circuit device and the intermediate surface region of the substrate.

6. The circuit assembly according to claim 1, wherein the solder connections are oppositely disposed on the circuit device, the at least one dam comprises a pair of dams on the substrate, and each of the dams is between the intermediate surface region of the substrate and a corresponding one of the at least two sets of bonding sites.

7. The circuit assembly according to claim 6, wherein the pair of dams are spaced apart to define the bidirectional venting path between the circuit device and the intermediate surface region of the substrate.

8. The circuit assembly according to claim 1, wherein the circuit device is a flip chip device.

9. The circuit assembly according to claim 1, wherein the movable element is a micromachine.

10. The circuit assembly according to claim 9, wherein the micromachine is a pressure-sensitive diaphragm.

\* \* \* \* \*